(12) United States Patent
Lee

(10) Patent No.: US 8,047,267 B2
(45) Date of Patent: Nov. 1, 2011

(54) APPARATUS FOR COOLING COMMUNICATION EQUIPMENT USING HEAT PIPE

(75) Inventor: Sang Kyun Lee, Icheon-si (KR)

(73) Assignee: Transpacific Sonic, LLC, Wilmington, DE (US)

( * ) Notice: Subject to any disclaimer, the term of this patent is extended or adjusted under 35 U.S.C. 154(b) by 853 days.

(21) Appl. No.: 10/569,049

(22) PCT Filed: Sep. 24, 2004

(86) PCT No.: PCT/KR2004/002475
§ 371 (c)(1),
(2), (4) Date: Nov. 7, 2006

(87) PCT Pub. No.: WO2005/032230
PCT Pub. Date: Apr. 7, 2005

(65) Prior Publication Data
US 2007/0056710 A1 Mar. 15, 2007

(30) Foreign Application Priority Data
Sep. 30, 2003 (KR) ........................ 10-2003-0067733

(51) Int. Cl.
*F28D 15/00* (2006.01)
*H05K 7/20* (2006.01)
*H01L 23/34* (2006.01)
(52) U.S. Cl. .............. 165/104.14; 165/104.33; 361/700; 257/715
(58) Field of Classification Search ............. 165/104.14, 165/104.33
See application file for complete search history.

(56) References Cited

U.S. PATENT DOCUMENTS 3,857,441 A * 12/1974 Arcella ............... 165/104.26
4,019,571 A * 4/1977 Kosson et al. .......... 165/104.26
4,833,567 A 5/1989 Saaski et al.
(Continued)

FOREIGN PATENT DOCUMENTS

JP 04196154 A * 7/1992
(Continued)

OTHER PUBLICATIONS

English Abstract of JP 04196154 A.*
(Continued)

*Primary Examiner* — Cheryl J Tyler
*Assistant Examiner* — Brandon M Rosati
(74) *Attorney, Agent, or Firm* — McDonnell Boehnen Hulbert & Berghoff LLP

(57) ABSTRACT

The present invention is directed to an apparatus for cooling communication equipment using a heat pipe, which releases heat from a heat-emitting unit by a simple, reliable and safe scheme. The present invention provides an apparatus for releasing heat, which comprises: a heat pipe for transferring heat generated in a heat-emitting unit of the communication equipment and being mounted on a predetermined location of the heat-emitting unit; a vaporizing unit for vaporizing liquid with the heat transferred via the heat pipe and draining the vaporized liquid through a vaporization line, wherein a lower part of the vaporizing unit contacts a predetermined location of the heat pipe; a condensing unit for performing heat-exchange by condensing the vaporized liquid from the vaporizing unit and returning the condensed liquid to the vaporizing unit through a condensation line; and a small capacity fan for releasing air to the outside when the condensing unit performs the heat-exchange.

8 Claims, 2 Drawing Sheets

U.S. PATENT DOCUMENTS

| | | | | |
|---|---|---|---|---|
| 4,894,709 | A * | 1/1990 | Phillips et al. | 257/714 |
| 5,076,352 | A * | 12/1991 | Rosenfeld et al. | 165/104.26 |
| 5,195,575 | A * | 3/1993 | Wylie | 165/132 |
| 5,396,947 | A * | 3/1995 | Itoh | 165/104.14 |
| 5,409,055 | A | 4/1995 | Tanaka et al. | |
| 5,899,265 | A * | 5/1999 | Schneider et al. | 165/104.33 |
| 6,650,543 | B2 * | 11/2003 | Lai et al. | 361/700 |
| 6,666,260 | B2 * | 12/2003 | Tantoush | 165/80.3 |
| 6,940,722 | B2 | 9/2005 | Tetsuka et al. | |
| 7,661,463 | B2 * | 2/2010 | Liu | 165/104.14 |
| 2001/0023757 | A1 | 9/2001 | Huang | |
| 2002/0088609 | A1 * | 7/2002 | Tantoush | 165/104.33 |
| 2004/0011511 | A1 * | 1/2004 | Ghosh et al. | 165/104.21 |
| 2004/0069459 | A1 | 4/2004 | Tonosaki et al. | |
| 2005/0145368 | A1 * | 7/2005 | Hsu | 165/104.11 |
| 2007/0034355 | A1 * | 2/2007 | Kuo | 165/80.4 |

FOREIGN PATENT DOCUMENTS

| | | |
|---|---|---|
| KR | 1020030079553 | 10/2003 |

OTHER PUBLICATIONS

International Search Report for PCT Pat. App. No. PCT/KR2004/002475.

International Preliminary Report on Patentability for PCT Pat. App. No. PCT/KR2004/002475.

* cited by examiner

APPARATUS FOR COOLING COMMUNICATION EQUIPMENT USING HEAT PIPE

TECHNICAL FIELD

The present invention generally relates to an apparatus for coding communication equipment using a heat pipe, and more particularly to an apparatus for coding communication equipment using a heat pipe, which releases heat from a heat-emitting unit by a simple, reliable and safe scheme.

BACKGROUND ART

It is generally desired to release heat from a heat-emitting unit (e.g., a power amp) of communication equipment. For such function, an indoor type equipment uses a large capacity fan, while an outdoor type equipment uses a separate coding system.

FIG. 1 shows an apparatus for releasing heat from a heat-emitting unit 10 using a large capacity fan in conventional communication equipment. FIG. 1 shows a heat-emitting unit 10 with ventilation holes 11, a shelf 20 in which the heat-emitting unit 10 is set up, and a large capacity fan 30 for releasing heat by releasing air flowing inward through the ventilation holes 11.

The operation of the apparatus for releasing heat using a large capacity fan is described below. First, the heat-emitting unit 10 with the ventilation holes 11 is set up in the shelf 20. Then, air flows into the ventilation holes 11 and the large capacity fan 30 disposed on the rear side of the shelf 20 rotates at a high speed. This is to release heat from the heat-emitting unit 10 by releasing air in the heat-emitting unit 10 to the outside.

FIG. 2 is a schematic view of an apparatus for releasing heat using a water-coding scheme in conventional communication equipment, in which liquid is circulated. FIG. 2 shows a heat-emitting unit 40, a heat-exchanger 50, and a liquid-circulation pump 60.

The operation of the apparatus for releasing heat using a water-coding scheme, in which liquid is circulated, is described below. First, a pipe, through which liquid can pass, is set up in a predetermined position with respect to the heat-emitting unit 40. Then, the liquid-circulation pump 60 is driven so that the cooling liquid may flow into one end (i.e., inlet) of the pipe and flow out from the other end (i.e., outlet) of the pipe. The liquid that flows out of the pipe absorbs the heat from the heat-emitting unit 40. Then, the liquid is coded again by the heat-exchanger 50 and flows into the liquid-circulation pump 60. Thereafter, the liquid coded by the heat-exchanger 50 flows into the inlet of the pipe again through the liquid-circulation pump 60 and the heat-exchanger 50. By repeating this procedure, the apparatus removes heat from the heat-emitting unit 40.

The conventional apparatuses, however, have the following problems. First, the scheme using a large capacity fan undesirably produces bud noises. Further, it cannot be used if the heat density exceeds a certain limit (e.g. 30W/cm $^3$). Moreover, the use of a heat-sink leads to a relatively large size.

Second, the water-coding scheme is disadvantageous in that the system itself and its components are formed inside a body, which makes it difficult to repair them. Its units are not detachable. It is also disadvantageous in that the life span of a water pump for circulating liquid is relatively short compared to that of a general fan. The short life span of the water pump limits the life span of the entire system. Further, the coding liquid may leak to cause critical faults in the communication equipment.

DISCLOSURE OF INVENTION

Technical Problem

Accordingly, the present invention is provided to solve the above-mentioned problems. The objective of the present invention is to provide an apparatus for coding communication equipment using a heat pipe, which releases heat from a heat-emitting unit by a simple, reliable and safe scheme.

Technical Solution

The apparatus for coding communication equipment using a heat pipe according to the present invention comprises:

a heat pipe for transferring heat generated by a heat-emitting unit of the communication equipment and being mounted on a predetermined location of the heat-emitting unit;

a vaporizing unit for vaporizing liquid with the heat transferred via the heat pipe and draining the vaporized liquid through a vaporization line, wherein the lower part of the vaporizing unit contacts a predetermined location of the heat pipe;

a condensing unit for performing heat-exchange by condensing the vaporized liquid from the vaporizing unit and returning the condensed liquid to the vaporizing unit through a condensation line; and a small capacity fan for releasing air to the outside when the condensing unit performs the heat-exchange.

BRIEF DESCRIPTION OF THE DRAWINGS

The above objective and features of the present invention will become more apparent from the following description of the preferred embodiments given in conjunction with the accompanying drawings.

BEST MODE FOR CARRYING OUT THE INVENTION

An apparatus for coding communication equipment using a heat pipe according to an embodiment of the present invention will be described below in detail with reference to the accompanying drawings.

Figure 1:
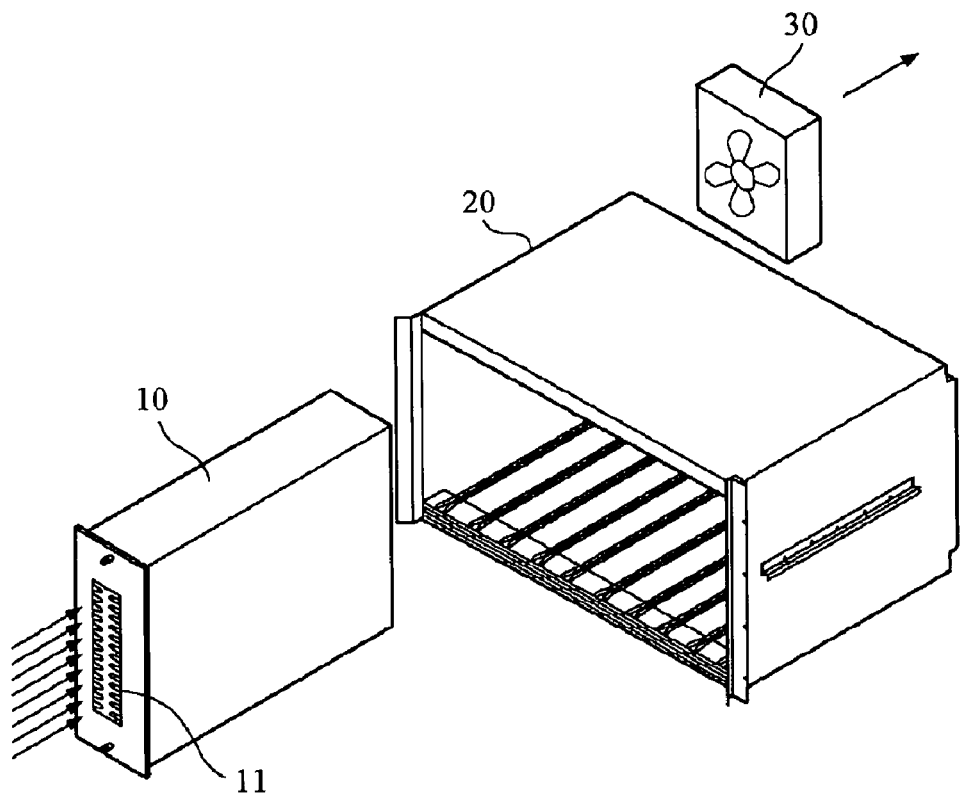
FIG. 1 is a perspective view showing a configuration of an apparatus for releasing heat from a heat-emitting unit using a large capacity fan in conventional communication equipment.
Figure 2:
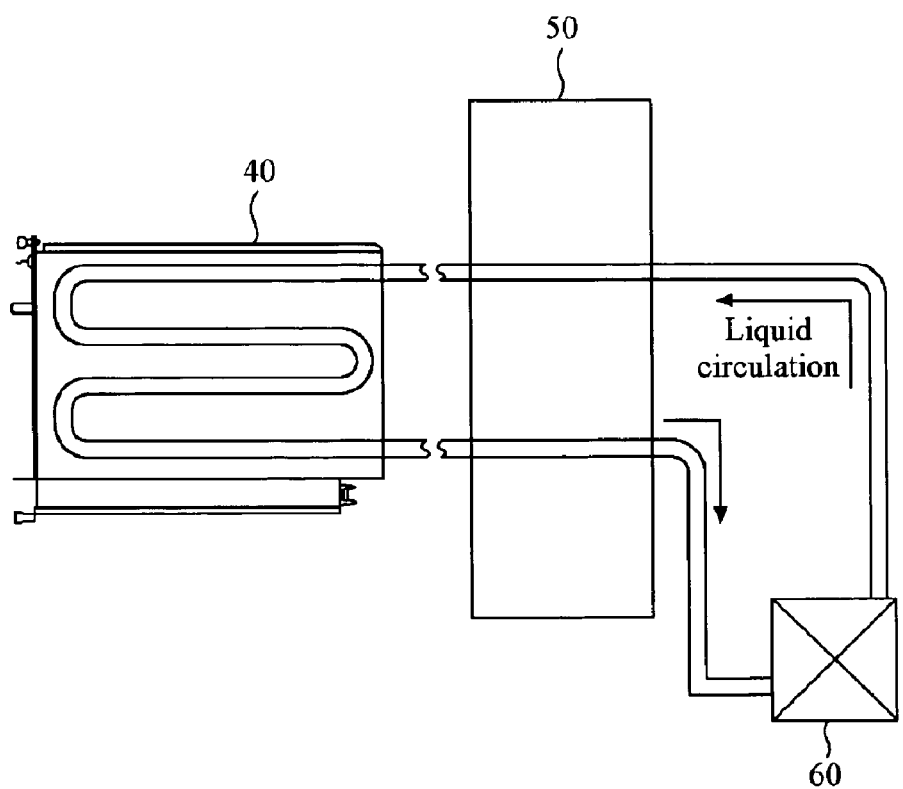
FIG. 2 is a schematic view showing a configuration of an apparatus for releasing heat using a water-coding scheme in conventional communication equipment, in which liquid is circulated.
Figure 3:
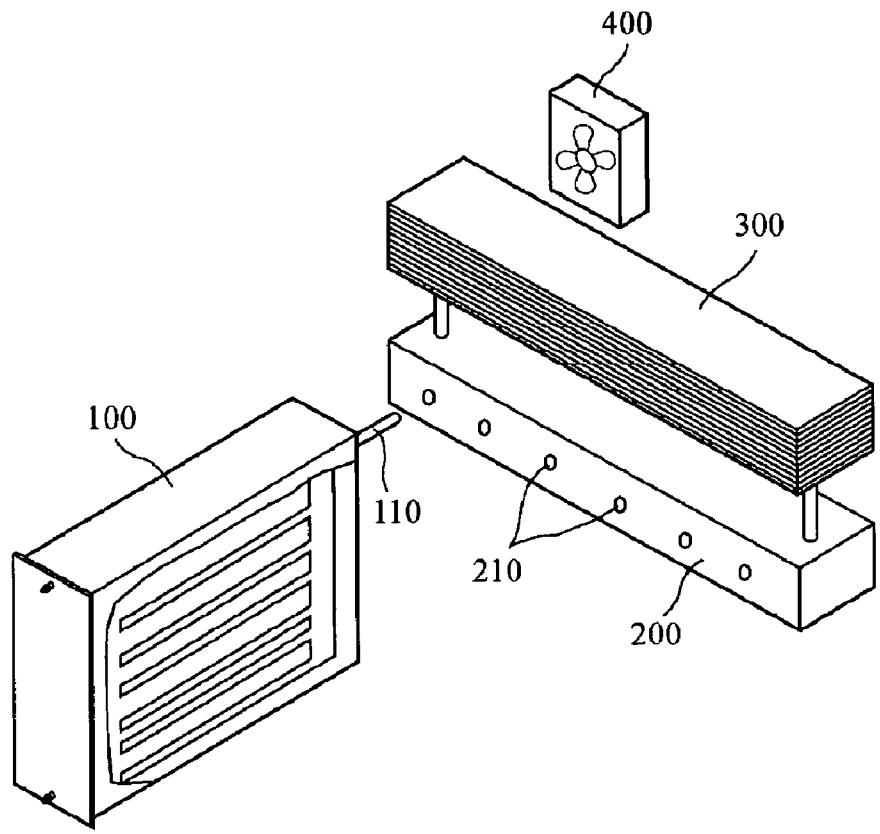
FIG. 3 is a perspective view showing a configuration of an apparatus for cooling communication equipment using a heat pipe according to an embodiment of the present invention.

FIG. 3 is a perspective view showing a configuration of an apparatus for coding communication equipment using a heat pipe according to the present invention. A heat pipe 110 is mounted on a predetermined location of a heat-emitting unit 100 and transfers heat generated by the heat-emitting unit 100. The lower part of a vaporizing unit 200, or receiving section, contacts a predetermined location of the heat pipe 110. A liquid-containing section of the vaporizing unit 200 contains and vaporizes the liquid in it with the heat transferred via the heat pipe 110 and drains the vaporized liquid through a vaporization line, while the liquid is not present in the receiving section.

A condensing unit 300 performs heat-exchange by condensing the vaporized liquid from the vaporizing unit 200. It then returns the condensed liquid to the liquid-containing section of the vaporizing unit 200 through a condensation line. A small capacity fan 400 releases air to the outside when the condensing unit 300 performs the heat-exchange.

Figure 4:
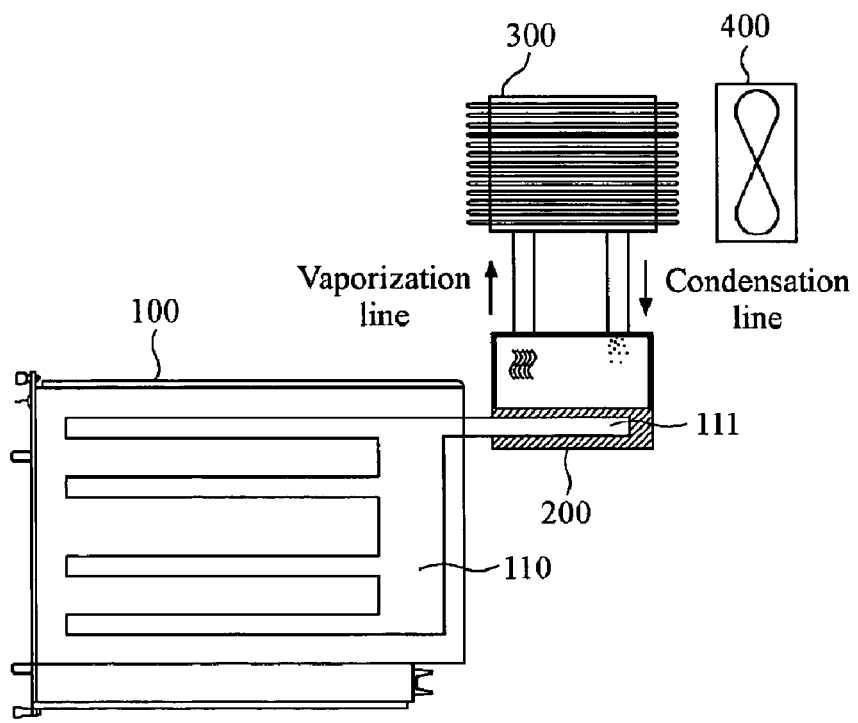
FIG. 4 is a schematic showing an operation of an apparatus for cooling communication equipment using a heat pipe according to an embodiment of the present invention.

FIG. 4 is a schematic showing an operation of an apparatus for cooling communication equipment using a heat pipe according to the present invention. A heat pipe 110 is mounted on a predetermined location of a heat-emitting unit 100 and transfers heat generated by the heat-emitting unit 100 to a vaporizing unit 200. The receiving section of the vaporizing unit 200 has insertion holes 210 into which an extended part 111 of the heat pipe 110 is inserted. This is so that the extended part 111 of the heat pipe 110 may contact the lower part of the vaporizing unit 200. As the contact between the heat pipe 110 and the vaporizing unit 200 becomes tighter, the heat-exchange becomes more efficient. Therefore, the insertion holes 210 may be preferably made out of Indium, which has a good heat-exchange property and is hardly damaged by friction. With the extended part 111 of the heat pipe 110 inserted into the insertion holes 210 of the receiving section without the extended part 111 extending into the liquid-containing section, the vaporizing unit 200 releases the heat by vaporizing liquid of the liquid-containing section with the heat transferred via the heat pipe. Then, the vaporized liquid flows into the condensing unit 300 through a vaporization line and is released to the outside by a small capacity fan 400, which is disposed in a predetermined position of the condensing unit 300. The small capacity fan 400 is typically employed by outdoor type communication equipment, and not by indoor type communication equipment.

The vaporized liquid is condensed and liquidized in the condensing unit 300 as it releases heat. The liquidized liquid returns to the liquid-containing section of the vaporizing unit 200 through a condensation line.

In summary, heat-exchanges occur while liquid is vaporized and condensed. The heat-exchanges are performed not using a separate power, but using the heat generated by the unit itself. Repeating the circulation performs the heat-release.

INDUSTRIAL APPLICABILITY

According to the present invention, an optimal heat-release is possible using a small sized heat-release apparatus, which does not need a separate power.

The invention claimed is:

1. An apparatus, comprising:
   a heat pipe, comprising a heat-absorbing portion configured to contact a predetermined location of a heat-emitting unit, and an extended portion;
   a vaporizing unit, comprising a receiving section having an insertion hole formed therein and an liquid-containing section containing a liquid, wherein the liquid is not present in the receiving section, wherein the liquid-containing section is above the receiving section, wherein the extended portion of the heat pipe extends into the receiving section of the vaporizing unit through the insertion hole without extending into the liquid-containing section, wherein the heat-absorbing portion of the heat pipe is outside of the vaporizing unit, wherein the vaporizing unit is configured for vaporizing the liquid in the liquid-containing section with heat transferred via contact with the extended portion of the heat pipe received in the insertion hole, and wherein the vaporizing unit is further configured for draining the vaporized liquid of the liquid-containing section through a vaporization line; and
   a condensing unit, configured to condense the vaporized liquid from the vaporizing unit and return the condensed liquid to the liquid-containing section of the vaporizing unit through a condensation line.

2. The apparatus of claim 1, wherein a portion of the vaporizing unit configured to contact the extended portion of the heat pipe comprises Indium.

3. The apparatus of claim 1, further comprising a plurality of heat pipes, wherein each heat pipe is configured to absorb heat generated by the heat-emitting unit and comprising a portion configured for mounting on a predetermined location of the heat-emitting unit, and an extended portion configured to transfer the absorbed heat, wherein the receiving section of the vaporizing unit has a plurality of insertion holes formed therein, each configured to receive the extended portion of a respective heat pipe of the plurality of heat pipes and wherein the vaporizing unit is configured to contact the plurality of heat pipes received in the plurality of insertion holes.

4. An apparatus, comprising:
   a heat pipe, comprising a heat-absorbing portion configured to contact a predetermined location of a heat-emitting unit, and an extended portion;
   a vaporizing unit, comprising a receiving section having an insertion hole formed therein and an liquid-containing section containing a liquid, wherein the liquid is not present in the receiving section, wherein the liquid-containing section is above the receiving section, wherein the extended portion of the heat pipe extends into the receiving section of the vaporizing unit through the insertion hole without extending into the liquid-containing section, wherein the heat-absorbing portion of the heat pipe is outside of the vaporizing unit, wherein the vaporizing unit is configured for vaporizing the liquid in the liquid-containing section with heat transferred via contact with the extended portion of the heat pipe received in the insertion hole, and wherein the vaporizing unit is further configured for draining the vaporized liquid of the liquid-containing section through a vaporization line;
   a condensing unit configured to condense the vaporized liquid from the vaporizing unit and return the condensed liquid to the liquid-containing section of the vaporizing unit through a condensation line; and
   a fan configured to release air heated by the condensing unit.

5. A method comprising:
   absorbing heat generated by a heat-emitting unit via a heat pipe, wherein the heat pipe comprises a heat-absorbing portion configured to contact a predetermined location of the heat-emitting unit and an extended portion;
   vaporizing a liquid contained in a liquid-containing section of a vaporizing unit with heat transferred from the extended portion of the heat pipe to the vaporizing unit through an insertion hole, wherein the vaporizing unit comprises a receiving section and the liquid-containing section, wherein the liquid-containing section is above the receiving section, wherein the receiving section has the receiving hole formed therein, wherein the liquid is not present in the receiving section of the vaporizing unit, wherein the extended portion of the heat pipe extends into the receiving section of the vaporizing unit through the insertion hole without extending into the liquid-containing section, and wherein the heat-absorbing portion of the heat pipe is outside of the vaporizing unit;

draining the vaporized liquid of the liquid-containing section of the vaporizing unit through a vaporization line to a condensing unit;

condensing the vaporized liquid in the condensing unit; and receiving the condensed liquid at the of the liquid-containing section of the vaporizing unit through a condensation line.

6. The method of claim 5 further comprising:

releasing air heated by the condensing unit to an outside area.

7. An apparatus, comprising:

means for absorbing heat generated by a heat-emitting unit, wherein the heat absorbing means comprises means for contacting the heat-emitting unit and transferring means for transferring the absorbed heat;

vaporizing means for vaporizing liquid with heat transferred via the transferring means received into the vaporizing means, wherein the vaporizing means include means for containing the liquid and means for receiving and contacting the transferring means, such that the transferring means does not extend into the means for containing the liquid, wherein the transferring means is above the means for containing the liquid, and wherein the liquid is not present in the means for receiving and contacting the transferring means; and condensing means for condensing the vaporized liquid, comprising means for returning the condensed liquid to the means for containing the liquid of the vaporizing means.

8. The apparatus of claim 7, further comprising:

means for releasing air heated by the condensing means to an outside area.

* * * * *

UNITED STATES PATENT AND TRADEMARK OFFICE
CERTIFICATE OF CORRECTION

| | | |
|---|---|---|
| PATENT NO. | : 8,047,267 B2 | Page 1 of 1 |
| APPLICATION NO. | : 10/569049 | |
| DATED | : November 1, 2011 | |
| INVENTOR(S) | : Lee | |

It is certified that error appears in the above-identified patent and that said Letters Patent is hereby corrected as shown below:

Column 3, line 60, in Claim 1, delete "an liquid-containing" and insert -- a liquid-containing --.

Column 4, line 32, in Claim 4, delete "an liquid-containing" and insert -- a liquid-containing --.

Column 5, lines 12-13, in Claim 5, delete "receiving the condensed liquid at the of the liquid-containing section" and insert -- receiving the condensed liquid at the liquid-containing section --.

Signed and Sealed this
Tenth Day of July, 2012

David J. Kappos
*Director of the United States Patent and Trademark Office*